United States Patent
Nakamura et al.

(10) Patent No.: US 8,297,568 B2
(45) Date of Patent: Oct. 30, 2012

(54) SUCKING AND HOLDING DEVICE

(75) Inventors: Akihiko Nakamura, Kawasaki (JP);
Junichi Katsuragawa, Kawasaki (JP)

(73) Assignee: Tokyo Ohka Kogyo Co., Ltd., Kawasaki-Shi (JP)

( * ) Notice: Subject to any disclaimer, the term of this patent is extended or adjusted under 35 U.S.C. 154(b) by 722 days.

(21) Appl. No.: 12/379,703

(22) Filed: Feb. 26, 2009

(65) Prior Publication Data
US 2009/0218460 A1    Sep. 3, 2009

(30) Foreign Application Priority Data
Mar. 3, 2008    (JP) .................................. 2008-051817

(51) Int. Cl.
*A47F 5/00*    (2006.01)
(52) U.S. Cl. .................. 248/206.1; 248/206.2; 248/683
(58) Field of Classification Search ............... 248/205.5, 248/205.6, 206.1, 206.2, 683, 309.3
See application file for complete search history.

(56) References Cited

U.S. PATENT DOCUMENTS

| | | | |
|---|---|---|---|
| 5,711,501 A * | 1/1998 | Belokin et al. ............. | 248/205.9 |
| 6,219,931 B1 * | 4/2001 | Roth ............................. | 33/645 |
| 6,405,983 B1 * | 6/2002 | Goj .............................. | 248/205.1 |
| 6,459,462 B1 * | 10/2002 | Seraphim et al. ............. | 349/73 |
| 6,895,642 B2 * | 5/2005 | Huang ............................ | 24/303 |
| 7,160,105 B2 * | 1/2007 | Edwards et al. ............ | 432/258 |
| 2003/0185664 A1 | 10/2003 | Mitsui et al. | |
| 2005/0128451 A1 | 6/2005 | Mitsui et al. | |
| 2005/0173064 A1 | 8/2005 | Miyanari | |
| 2007/0151674 A1 | 7/2007 | Miyanari | |
| 2009/0029629 A1 * | 1/2009 | Shin et al. .................... | 451/5 |

FOREIGN PATENT DOCUMENTS

| | | |
|---|---|---|
| JP | 6115231 | 1/1986 |
| JP | 2000208445 | 7/2000 |
| JP | 2001235500 | 8/2001 |
| JP | 2002217276 | 2/2002 |
| JP | 2003282427 | 10/2003 |
| JP | 2006135272 | 5/2006 |

OTHER PUBLICATIONS

Office Action as mailed Dec. 6, 2011 in Japanese Application No. 2008-051817.

* cited by examiner

*Primary Examiner* — Terrell McKinnon
*Assistant Examiner* — Steven Marsh
(74) *Attorney, Agent, or Firm* — Edwards Wildman Palmer LLP; David J. Silvia

(57) ABSTRACT

A sucking and holding device includes: a vacuum chuck for vacuum-sucking a substrate; and a suction assisting device for sandwiching the object between it and the vacuum chuck. The suction assisting device includes a substrate-facing surface. The substrate-facing surface seals a through hole provided in the substrate. With this configuration, the sucking and holding device can vacuum-suck and hold the substrate having a through hole. This leads to an accomplishment of a device which can hold various objects without positional displacement.

2 Claims, 4 Drawing Sheets

SUCKING AND HOLDING DEVICE

This Nonprovisional application claims priority under 35 U.S.C. §119(a) on Patent Application No. 2008-051817 filed in Japan on Mar. 3, 2008, the entire contents of which are hereby incorporated by reference.

TECHNICAL FIELD

The present invention relates to a sucking and holding device for sucking an object to be sucked, thereby to hold the object. Especially, the present invention relates to a sucking and holding device which is provided with vacuum suction and holding means for sucking and holding an object to be sucked and held.

BACKGROUNDS ART

A vacuum sucking and holding device which sucks and holds an object by vacuuming is sometimes used in following cases: an object is processed or treated while being held; an object is transferred while being held on a carrier; and an object is positionally adjusted (aligned) while being held on a carrier (see Patent Literature 1: Japanese Patent Application Publication, Tokukai, No. 2003-282427 A (Publication Date: Oct. 3, 2003)). Such a vacuum sucking and holding device is suitable for use especially in performing a process on and alignment for a substrate or the like, because in using the vacuum sucking and holding device, an object to be sucked and held does not need any special treatment on itself, and moreover the vacuum sucking and holding device hardly hurts the object in holding the object.

However, there is an object which cannot be sucked appropriately by the vacuum sucking and holding device. For example, a support plate is described in Patent Literature 2: Japanese Patent Application Publication, Tokukai, No. 2006-135272 A (Publication Date: May 25, 2006). The support plate has a plurality of through holes, and therefore the support plate cannot be sucked by the vacuum sucking and holding device. That is, when the vacuum sucking and holding device vacuums the support plate, air is inflowed through the through holes, and therefore a vacuum state (reduced-pressure state) cannot be produced between the support plate and the vacuum sucking and holding device. As a result, the support plate cannot be sucked. Moreover, for example, a copper substrate etc. may have a flexure, which allow air to inflow from a gap formed by the flexure. This prevents the vacuum sucking and holding device from sucking and holding the substrate.

Previously, the following devices are used for an object which is not suitable for being sucked and held by such a vacuum sucking and holding device. As shown in FIG. 10, a device holds an object by a frictional force of such as rubber. Alternatively, as shown in FIG. 11, a device holds an object to be held, by setting the object in a frame whose shape is fit with the object.

As described above, there exists no device which can hold various objects without fear of positional displacement so far.

For example, as described above, there is an object which is not suitable for being sucked and held. Moreover, in using a device provided with a rubber 1002 or the like for holding an object 1001 by a frictional force as shown in FIG. 10, a force for holding the object 1001 is only the frictional force. Therefore, when a large force is applied on the object 1001, the object 1001 would be positionally displaced with respect to a supporting base 1003. Further, in using a device provided with a supporting base 1102 having a frame whose shape fits with an object to be held 1101 as shown in FIG. 11, the object 1101 is held by being set in the frame. For a smooth set-in, a gap (allowance) 1103 is required, and because of the gap 1103, positional displacement of the object 1101 with respect to the supporting base 1102 may occur.

Therefore, there is a demand for a device which can hold various objects without the fear of positional displacement.

SUMMARY OF INVENTION

The present invention is accomplished in consideration of the aforementioned problems. A main object of the invention is to provide a sucking and holding device which can hold various objects without the fear of positional displacement.

A sucking and holding device of the present invention includes: vacuum suction and holding means for vacuum-sucking and holding an object to be sucked and held; and suction assisting means for sandwiching the object between it and the vacuum suction and holding means.

For a fuller understanding of the nature and advantages of the invention, reference should be made to the ensuing detailed description taken in conjunction with the accompanying drawings.

BRIEF DESCRIPTION OF DRAWINGS

FIG. 1 is a cross-sectional view schematically illustrating a structure of a sucking and holding device in a first embodiment of the present invention.

FIG. 2 is a cross-sectional view illustrating a state where an object is being sucked and held by the sucking and holding device in the first embodiment of the present invention.

FIG. 3 is a cross-sectional view illustrating a variation of suction assisting means of the sucking and holding device in the first embodiment of the present invention.

FIG. 4 is a cross-sectional view schematically illustrating a structure of a sucking and holding device in a second embodiment of the present invention.

FIG. 5 is a cross-sectional view illustrating a state where the sucking and holding device in the second embodiment of the present invention starts sucking an object to be sucked and held.

FIG. 6 is a cross-sectional view illustrating a state where the object is being sucked and held by the sucking and holding device in the second embodiment of the present invention.

FIG. 7 is a cross-sectional view schematically illustrating a structure of a sucking and holding device in a third embodiment of the present invention.

FIG. 8 is a top view illustrating a structure of an object to be sucked and held by the sucking and holding device in the third embodiment of the present invention.

FIG. 9 is a top view illustrating a variation of an object to be sucked and held by the sucking and holding device in the third embodiment of the present invention.

FIG. 10 is a cross-sectional view schematically illustrating a structure of a holding device of a conventional art.

FIG. 11 is a cross-sectional view schematically illustrating a structure of a holding device of a conventional art.

DESCRIPTION OF EMBODIMENT

[First Embodiment]

Figure 1:
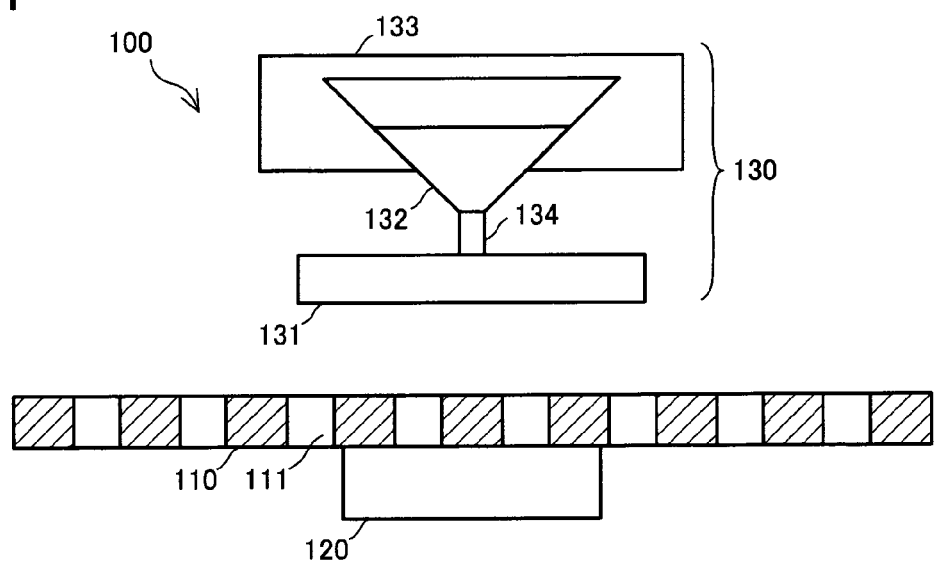
FIG. 1

First, a structure of a sucking and holding device 100 in a first embodiment of the present invention is explained below. FIG. 1 is a cross-sectional view schematically illustrating the structure of the sucking and holding device 100. As shown in FIG. 1, the sucking and holding device 100 includes a vacuum chuck (vacuum suction and holding means) 120 and a suction assisting device (suction assisting means) 130. FIG. 1 shows a state where a substrate (object to be sucked and held) 110 having a hole 111 is mounted on the vacuum chuck 120. Note that the present invention is not limited to the present description in which the substrate 110 is used as an object to be sucked and held by the sucking and holding device 100 for example. The object to be sucked and held is not limited particularly as long as the sucking and holding device 100 can suck and hold the object. An object such as a substrate (wafer), which has a smooth surface is suitable for being sucked and held.

The vacuum chuck 120 is not limited as long as the chuck can vacuum-suck and hold an object to be sucked and held by use of a mechanism such as a vacuum pump. A general vacuum chuck may be used. Note that, in this description, the term "vacuum suction and holding" indicates that a reduced-pressure state is produced in a contact section which contacts with an object to be sucked and held, and thereby the object is sucked and held by a difference between the reduced pressure and surrounding pressure. The contact section (a space formed by the object to be sucked and held, and the contact section) is not necessarily vacuum state. Moreover, the term "vacuum suction and holding" may be also referred to as "vacuuming" in some cases. Suction volume or the like of the vacuum chuck 120 may be selected in accordance with a size or the like of the object to be sucked and held. For example, in a case where a glass substrate having through holes (diameter of the substrate: 200 mm, thickness: 0.7 mm, diameter of the through hole: 0.4 mm, and a pitch between the through holes: 0.6 mm) is sucked and held, a vacuum chuck with suction volume of 30 L/min may be suitable for use as the vacuum chuck 120.

The suction assisting device 130 includes a substrate-facing surface 131, a cylinder 132, a cylinder holder 133, and a shaft 134. The substrate-facing surface 131 of the suction assisting device 130 faces to the substrate 110. As explained later, the substrate-facing surface 131 is a surface which contacts with the substrate 110 and seals the through hole 111. Therefore, the substrate-facing surface 131 is preferable to be made of a material which hardly has air permeability. For example, the substrate-facing surface 131 can be suitably made of synthetic resin, natural resin, soft glass, hard glass, iron, aluminum, copper, stainless steel, or the like. Moreover, a material such as synthetic resin which has flexibility may be especially suitable for use as the material of the substrate-facing surface 131, because the through hole 111 may be sealed efficiently without hurting the substrate 110.

Moreover, the substrate-facing surface 131 is preferable to have a surface shape for sealingly contacting with the substrate 110 so as to seal the through hole 111 efficiently. That is, when the substrate 110 and the substrate-facing surface 131 are contacted with each other, surface of the substrate 110 and the substrate-facing surface 131 are preferable to be in sealingly contact with each other completely. For example, as in the present embodiment, in a case where a substrate is to be sucked and held by the sucking and holding device 100, the substrate-facing surface 131 is preferable to have a flat plane surface. Moreover, a diameter of the substrate-facing surface 131 is preferable to be larger than an inside diameter of the vacuum chuck 120, so as to be large enough to wholly cover some holes, which are being vacuumed by the vacuum chuck 120, of the through holes 111.

The substrate-facing surface 131 is connected via the shaft 134 to the cylinder 132 contained in the cylinder holder 133.

The cylinder 132 has a truncated cone shape whose diameter is enlarging upward. The bottom part of the cylinder 132 is connected via the shaft 134 to the substrate-facing surface 131 outside of the cylinder holder 133. The cylinder holder 133 has a hollow of a truncated cone shape whose slope is the same as that of the cylinder 132. The cylinder 132 is contained in the hollow. Moreover, at the bottom of the cylinder holder 133, a hole is provided for letting the shaft 134 out therethrough. The hole for letting the shaft 134 out has a diameter larger than a diameter of the shaft 134. With this arrangement, the shaft 134 can rotate and shift in horizontal direction.

The hollow of truncated cone shape in the cylinder holder 133 is larger in size than the cylinder 132 of truncated cone shape. With this arrangement, the cylinder 132 can float inside the cylinder holder 133, and the substrate-facing surface 131 connected to the cylinder 132 can also float.

Note that, as shown in FIG. 1, in a state where the substrate-facing surface 131 is not contacted with the substrate 110 (standby state), the cylinder 132 remains at the bottom of the cylinder holder 133. In this case, a horizontal position of the cylinder 132 is regulated by the cylinder holder 133. Therefore, the horizontal position of the substrate-facing surface 131 can always be constant in the standby state.

Figure 3:
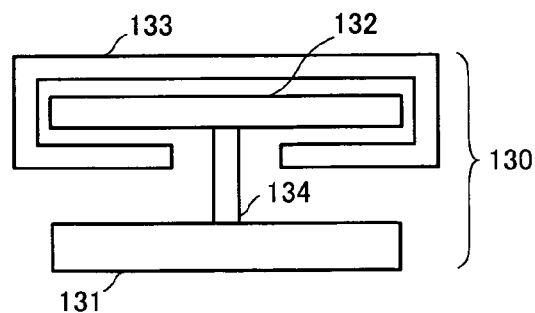
FIG. 3

The suction assisting device 130 may have a shape different from the shape described above. FIG. 3 is a cross-sectional view illustrating another structure of a suction assisting device of the sucking and holding device 100 in the first embodiment of the present invention. As shown in FIG. 3, the cylinder 132 may have a cylindrical shape. In that case, the cylindrical shape of the cylinder holder 133 may have a hollow whose size is larger than the cylinder 132, and the cylinder holder 133 has a hole at the bottom for letting out the shaft 134 connected to the cylinder 132. In this configuration also, the substrate-facing surface 131 connected to the shaft 134 can float.

As described above, shapes of a cylinder 132, a cylinder holder 133, and shaft 134 are not particularly limited as long as a substrate-facing surface 131 can float. Moreover, the cylinder 132 and the cylinder holder 133 are preferably made of a material(s) which allow the cylinder 132 and the cylinder holder 133 to easily slide on each other. An Example of such a combination is a combination of resin and metal such as stainless steel. Note that, for example, the cylinder 132 is preferable to be made of resin because a floating part in the suction assisting device 130 can be lightweight.

The substrate 110 is not limited in its diameter, thickness, material, and the like as long as the substrate 110 is a general substrate and has a through hole 111. A plurality of the through holes 111 of the substrate 110 may be provided, and the through hole 111 is also not limited in diameter. For example, the substrate 110 of the present embodiment includes a substrate made of a porous material such as a silicon substrate through which air can permeate.

Moreover, the substrate 110 may be mounted on the vacuum chuck 120 by an arbitrary means. A well known art such as a transfer robot may be used for the mounting.

Figure 2:
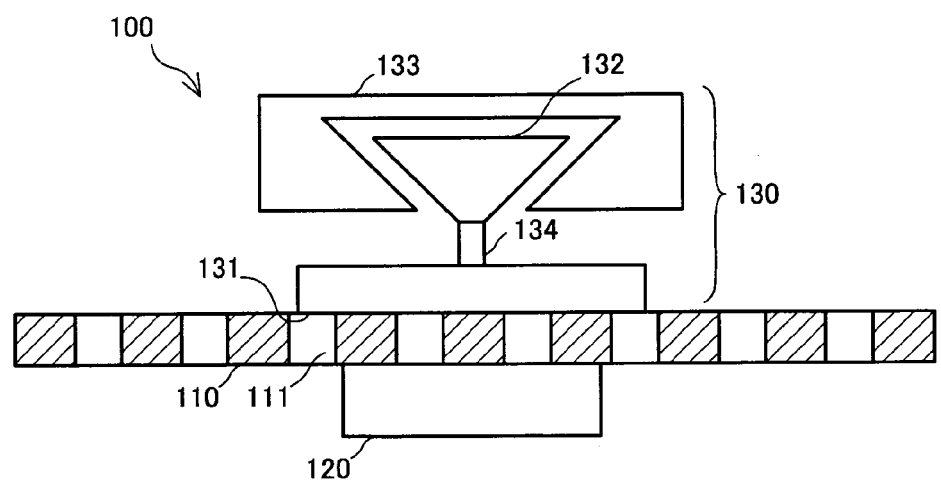
FIG. 2

Next, a mechanism that the sucking and holding device 100 sucks and holds the substrate 110 is explained. FIG. 2 is a cross-sectional view illustrating a state where the substrate 110 is being sucked and held by the sucking and holding device 100. As shown in FIG. 2, in a state where the substrate 110 is being sucked and held by the sucking and holding device 100, the substrate-facing surface 131 is in contact with the substrate 110. Moreover, in this case, the cylinder 132 remains floated off the cylinder holder 133, and can move freely.

Here, in a case where a suction assisting device 130 is not provided (that is, a conventional sucking and holding device), even though the vacuum chuck 120 tries to vacuum the substrate 110, the substrate 110 is very difficult to be sucked because air will inflow through the through hole 111. On the other hand, in the sucking and holding device 100 of the present invention, the substrate-facing surface 131 of the suction assisting device 130 seals the through hole 111. With this configuration, air does not inflow through the through hole 111, and the vacuum chuck 120 can easily vacuum-suck and hold the substrate 110. Note that, in a case where the substrate-facing surface 131 has a shape for sealingly contacting with the substrate 110, the through hole 111 is completely sealed, and thereby the sucking and holding device 100 can vacuum-suck and hold the substrate 110 further easily.

In order to make the substrate-facing surface 131 contact with the substrate 110, the cylinder holder 133 may be moved toward the substrate 110 from the standby state shown in FIG. 1. For example, the cylinder holder 133 is moved by an actuator (not illustrated). Note that, if the substrate-facing surface 131 can float inside the suction assisting device 130, the substrate-facing surface 131 will remain in a state of contacting with the substrate 110 without controlling the move of the cylinder holder 133 precisely.

Moreover, as described later, the sucking and holding device 100 may perform rotation, positional adjustment, transferring, and the like while sucking and holding the substrate 110. If the substrate-facing surface 131 can float inside the suction assisting device 130, the rotation, positional adjustment, transferring, and the like of the substrate 110 can be performed without making adjustment. In order to rotate the substrate 110, for example, a commercial vacuum chuck (spin chuck) whose suction surface can rotate may be used as the vacuum chuck 120. In performing such as cleaning of an edge face of the substrate 110, a rotation speed may be approximately 2000 to 3000 rpm for example. In performing alignment, a rotation speed may be approximately 1000 rpm for example. Note that, the suction assisting device 130 may be grinded thereby generating grinding dust by the rotation. Therefore, a tray for receiving the grinding dust may be provided below the substrate 110.

The sucking and holding device 100 in the present embodiment can hold the substrate 110. Therefore, the sucking and holding device 100 is suitable for use in subjecting the substrate 110 to (i) a process of such as, for example, cutting, boring, caving, grinding, surface modification, coating, and functional film formation, or to (ii) treatment such as cleaning on the substrate 110. The sucking and holding device 100 may be incorporated in, for example, a lathe, a miller, a drilling machine, a flat-surface grinding machine, a machining center, a spin coater, a washer or the like. Moreover, transferring and alignment of the substrate 110 can be performed by moving whole of the sucking and holding device 100, or the vacuum chuck 120 while sucking the substrate 110 (note that, in the after-described third embodiment, an embodiment in which a sucking and holding device of the present invention is used for alignment is explained).

[Second Embodiment]

Figure 4:
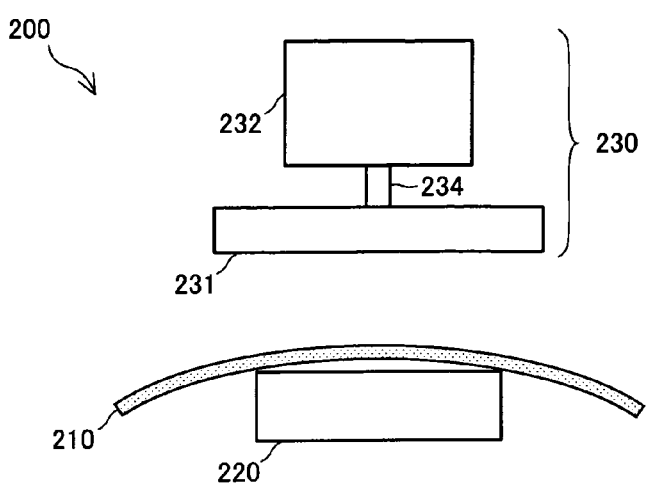
FIG. 4

A sucking and holding device 200 in a second embodiment of the present invention is described below. FIG. 4 is a cross-sectional view schematically illustrating a structure of the sucking and holding device 200. As shown in FIG. 4, the sucking and holding device 200 includes a vacuum chuck (vacuum suction and holding means) 220 and a suction assisting device (suction assisting means) 230. FIG. 4 shows a state where a flexed substrate (object to be sucked and held) 210 is mounted on the vacuum chuck 220.

As the vacuum chuck 220, the same vacuum chuck as the vacuum chuck 120 in the first embodiment may be used.

The suction assisting device 230 includes a substrate-facing surface 231, actuator 232, and a shaft 234. The actuator 232 is connected via the shaft 234 to the substrate-facing surface 231. As the substrate-facing surface 231, the same substrate-facing surface as the substrate-facing surface 131 in the first embodiment may be used.

For example, the substrate 210 is a substrate made of copper or the like, and flexed because of such as deformation by own weight and expansion by heat. Therefore, as shown in FIG. 4, in the state where the substrate-facing surface 231 of the suction assisting device 230 is not contacted with the substrate 210 (standby state), there is a gap between the vacuum chuck 220 and the substrate 210. Therefore, when the vacuum chuck 220 vacuums the substrate 210, the substrate 210 is difficult to be vacuum-sucked because air will inflow through the gap.

Figure 5:
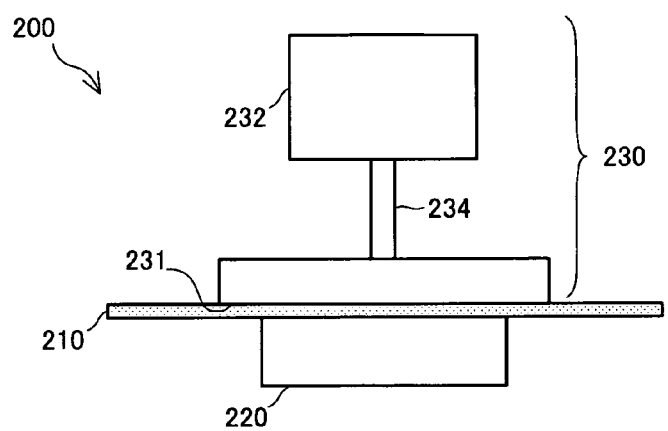
FIG. 5

FIG. 5 is a cross-sectional view illustrating a state where the sucking and holding device 200 starts sucking the substrate 210. As shown in FIG. 5, when the sucking and holding device 200 starts sucking the substrate 210, the actuator 232 pushes the substrate-facing surface 231 to the substrate 210. By doing this, flexure of the substrate 210 is corrected, and the gap between the substrate 210 and the vacuum chuck 220 is reduced. With this configuration, the sucking and holding device 200 can suck and hold the substrate 210 easily.

Figure 6:
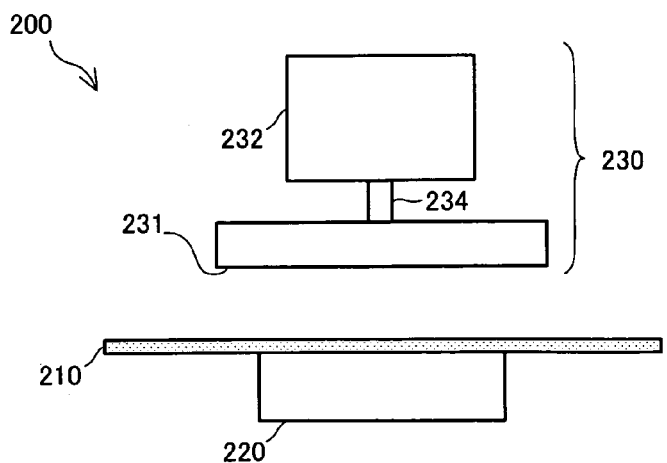
FIG. 6

FIG. 6 is a cross-sectional view illustrating a state where the substrate 210 is being sucked and held by the sucking and holding device 200. As shown in FIG. 6, once the substrate 210 is sucked and held by the vacuum chuck 220, the substrate 210 can remain sucked and held even after the substrate-facing surface 231 is detached from the substrate 210. Therefore, various processes or treatments as explained in the first embodiment can be performed to the substrate 210.

[Third Embodiment]

Figure 7:
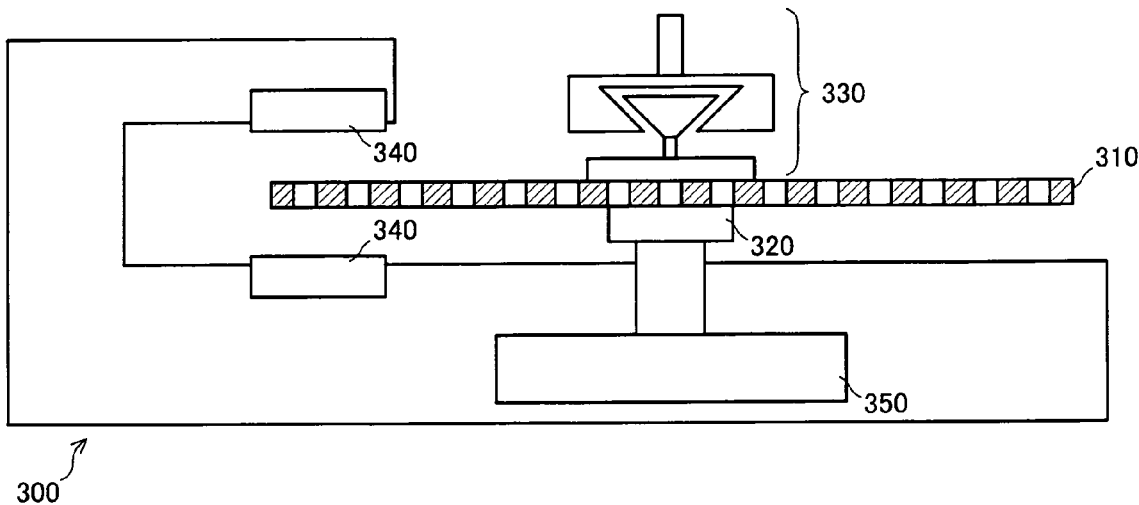
FIG. 7

FIG. 7 is a cross-sectional view schematically illustrating a structure of a sucking and holding device (alignment device) 300 in a third embodiment of the present invention. As shown in FIG. 7, the sucking and holding device 300 includes a vacuum chuck (vacuum suction and holding means) 320, a suction assisting device (suction assisting means) 330, a sensor 340, and a positional adjustment section (positional adjustment means) 350.

The sucking and holding device 300 operates as what is called an alignment device. The sucking and holding device 300 holds a substrate (object to be sucked and held) 310, and adjusts a position of the substrate 310.

As the vacuum chuck 320, the same vacuum chuck as the vacuum chuck 120 in the first embodiment may be used. Note that, in the present embodiment, the vacuum chuck 320 rotates the substrate 310 at a rotation speed of, for example, approximately 1000 rpm.

As the suction assisting device 330, the same suction assisting device as the suction assisting device 130 in the first embodiment may be used.

Figure 8:
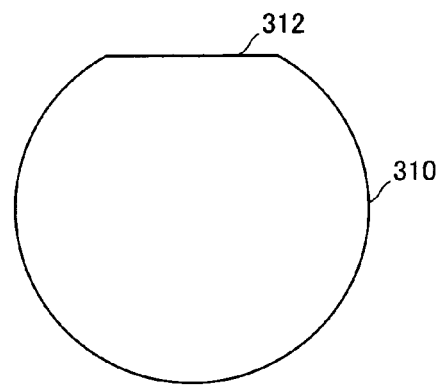
FIG. 8
Figure 9:
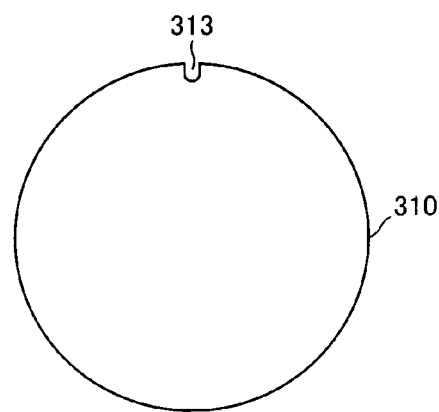
FIG. 9
Figure 10:
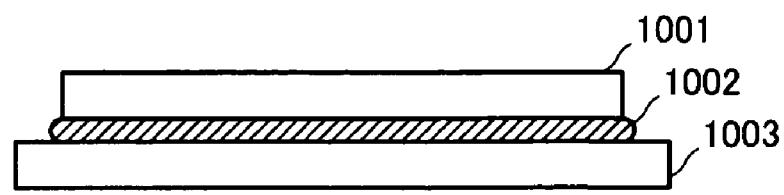
FIG. 10
Figure 11:
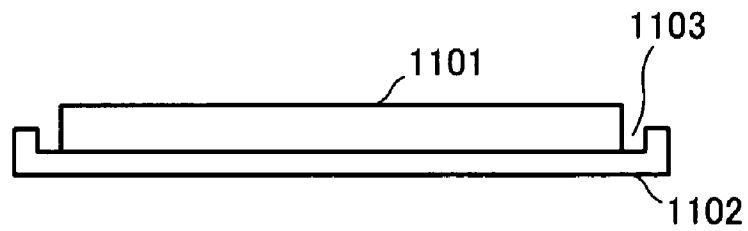
FIG. 11

The substrate 310 is the same substrate having a through hole as the substrate 110 in the first embodiment. However, the substrate 310 has, as shown in FIG. 8, an orientation flat 312 as a mark for alignment. Note that, the mark for alignment is not limited in its shape. For example, the shape may be a notch (cutout) 313 as shown in FIG. 9.

As in the present embodiment, even in a case where a sucking and holding device in the present invention is used as an alignment device, an object to be sucked and held by the sucking and holding device is not particularly limited. The object to be sucked and held is not necessarily a substrate having a through hole. For example, in a case where a flexed substrate is used as the object to be sucked and held, the same suction assisting device as the suction assisting device 230 in the second embodiment instead of the suction assisting device 330 in the present embodiment.

The sensor 340 is a sensor which can detect the above described mark for alignment. For example, a general transmission sensor can be used.

The positional adjustment section 350 adjusts a horizontal position of the substrate 310 based on a detection result of the sensor 340. As the positional adjustment section 350, a general actuator can be used. As shown in FIG. 7, the positional adjustment section 350 adjusts a position of the vacuum chuck 320, and thereby adjusts a position of the substrate 310 which is held on the vacuum chuck 320.

The following is an explanation of steps of alignment by the sucking and holding device 300. The alignment is performed after the substrate 310 is sucked and held by the vacuum chuck 320.

As described above, in performing alignment, the vacuum chuck 320 rotates the substrate 310. The sensor 340 detects the peripheral part and the orientation flat 312 of the rotating substrate 310. A control section (not illustrated) of the sucking and holding device 300 controls (i) rotation of vacuum chuck 320 and (ii) positional adjustment section 350 based on a detection result inputted from the sensor 340, and thereby adjusts a horizontal position and rotation angle (θ) of the substrate 310 to a predetermined position.

More specifically, when a center of rotation of the vacuum chuck 320 and a center of the substrate 310 are coincident with each other, the peripheral part of the substrate 310 detected by the sensor 340 keeps the same position all the time. Failure in the coincidence of the centers can be detected based on a detected result of the peripheral part of the substrate 310 by the sensor 340. Moreover, a rotation angle of the substrate 310 can be calculated out by detecting the orientation flat 312 by the sensor 340. The control section calculates an adjustment amount of horizontal position of the substrate 310 and a rotation angle (θ) of substrate 310 based on the detection results. The calculation of the adjustment amount can be carried out by, for example, a well known method for persons skilled in the art as described in such as Patent Literature 2. The control section controls the positional adjustment section 350 and the vacuum chuck 320 according to the calculated adjustment amount. With the configuration, alignment of the substrate 310 can be performed.

As described above, a sucking and holding device in the present invention can vacuum-suck and hold various objects such as a substrate having a through hole and a flexed substrate. Therefore, the use of the sucking and holding device of the present invention as an alignment device can provide a device which can perform alignment of various objects.

A sucking and holding device of the present invention includes vacuum suction and holding means for vacuum-sucking and holding an object to be sucked and held, and thereby the object to be sucked and held can be vacuum-sucked and held.

As described above, a device of a conventional art for vacuum-sucking and holding an object to be sucked and held cannot suck objects to be sucked and held having a through hole and a flexure.

On the other hand, a sucking and holding device of the present device includes a suction assisting means for sandwiching the object between it and the vacuum suction and holding means. In the sucking and holding device of the present invention, a through hole of an object to be sucked and held with a through hole can be sealed by using the suction assisting means. This leads to an easy suction of an object to be sucked and held having a through hole. Moreover, with the sucking and holding device of the present invention, a flexure of a flexed object to be sucked and held can be corrected by the suction assisting means. This leads to an easy suction of a flexed object. The suction is performed by vacuuming, and that can hold an object more firmly than by a frictional force. Moreover, an allowance is not necessary, and therefore positional displacement will not occur.

As described above, by the sucking and holding device of the present invention, various objects can be held without positional displacement.

The present invention is widely usable in a field of manufacturing industrial products, because the present invention can preferably hold an object to be processed or treated.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A sucking and holding device comprising:
   vacuum suction and holding means for vacuum-sucking and holding an object to be sucked and held;
   suction assisting means for sandwiching the object between it and the vacuum suction and holding means, the object having a through hole,
   the suction assisting means sealing the through hole,
   the vacuum suction and holding means vacuuming the suction assisting means via the through hole;
   a sensor for detecting a position of the object to be sucked and held; and
   positional adjusting means for moving the vacuum suction and holding means, the positional adjusting means adjusting a horizontal position of the vacuum suction and holding means so that the object is adjusted to a predetermined horizontal position based on a horizontal position of the object detected by the sensor.

2. The sucking and holding device as set forth in claim 1, the positional adjusting means adjusts the horizontal in a state in which the object to be sucked is sandwiched between the vacuum suction and holding means and the suction assisting means.

* * * * *